United States Patent
Paek et al.

(10) Patent No.: US 9,142,495 B2
(45) Date of Patent: Sep. 22, 2015

(54) LEAD FRAME AND SEMICONDUCTOR PACKAGE MANUFACTURED BY USING THE SAME

(71) Applicant: MDS CO., LTD., Changwon-si (KR)

(72) Inventors: Sung-Kwan Paek, Changwon (KR); Dong-Il Shin, Changwon (KR); Se-Chuel Park, Changwon (KR)

(73) Assignee: HAESUNG DS CO., LTD., Changwon-Si (KR)

( * ) Notice: Subject to any disclaimer, the term of this patent is extended or adjusted under 35 U.S.C. 154(b) by 0 days.

(21) Appl. No.: 14/363,854

(22) PCT Filed: Dec. 3, 2012

(86) PCT No.: PCT/KR2012/010368
§ 371 (c)(1),
(2) Date: Jun. 9, 2014

(87) PCT Pub. No.: WO2013/089376
PCT Pub. Date: Jun. 20, 2013

(65) Prior Publication Data
US 2014/0319666 A1  Oct. 30, 2014

(30) Foreign Application Priority Data

Dec. 12, 2011  (KR) .................. 10-2011-0133051
Oct. 29, 2012  (KR) .................. 10-2012-0120619

(51) Int. Cl.
*H01L 23/495*  (2006.01)
*H01L 21/48*  (2006.01)

(52) U.S. Cl.
CPC ...... *H01L 23/49582* (2013.01); *H01L 23/4952* (2013.01); *H01L 23/49548* (2013.01); *H01L21/4821* (2013.01); *H01L 23/49513* (2013.01); *H01L 2224/32245* (2013.01); *H01L 2224/45147* (2013.01); *H01L 2224/48247* (2013.01);
(Continued)

(58) Field of Classification Search
CPC .................................................. H01L 23/49582
USPC .......................................................... 257/676
See application file for complete search history.

(56) References Cited

U.S. PATENT DOCUMENTS 6,518,508 B2  2/2003  Park et al.
8,564,107 B2  10/2013  Cho et al.
(Continued)

FOREIGN PATENT DOCUMENTS

JP  2011-228589 A  11/2011
KR  2002-0045360 A  6/2002
(Continued)

OTHER PUBLICATIONS

International Search Report (PCT/ISA/210) dated Mar. 4, 2013, issued in International Application No. PCT/KR2012/010368.
(Continued)

*Primary Examiner* — Luan C Thai
(74) *Attorney, Agent, or Firm* — Sughrue Mion, PLLC

(57) ABSTRACT

The present invention provides a lead frame having excellent solder wettability and solderability, that is well-bonded to a copper wire, and manufactured with low cost, and a semiconductor package manufactured by using the same. The lead frame includes: a base material; a first metal layer formed on at least one surface of the base material, the first metal layer comprising nickel; a second metal layer formed on a surface of the first metal layer, the second metal layer comprising palladium; and a third metal layer formed on a surface of the second metal layer, the third metal layer comprising silver.

17 Claims, 5 Drawing Sheets

(52) U.S. Cl.
CPC ............. *H01L 2224/73265* (2013.01); *H01L 2924/01015* (2013.01); *H01L 2924/01047* (2013.01); *H01L 2924/15311* (2013.01)

(56) References Cited

U.S. PATENT DOCUMENTS

2011/0079887 A1* 4/2011 Shim et al. .................... 257/676
2011/0272184 A1 11/2011 Park et al.

FOREIGN PATENT DOCUMENTS

KR 10-2010-0028791 A 3/2010
KR 10-2010-0103015 A 9/2010

OTHER PUBLICATIONS

Written Opinion (PCT/ISA/237) dated Mar. 4, 2013, issued in International Application No. PCT/KR2012/010368.

* cited by examiner

LEAD FRAME AND SEMICONDUCTOR PACKAGE MANUFACTURED BY USING THE SAME

TECHNICAL FIELD

The present invention relates to an electric device, and more particularly, to a lead frame and a semiconductor package manufactured by using the same.

BACKGROUND ART

A lead frame serves to electrically connect a semiconductor chip to an external device and also support the semiconductor chip. A semiconductor package is manufactured by attaching and bonding the semiconductor chip to a lead frame by using a bonding wire and then by sealing the obtained structure with mold resin.

SUMMARY OF INVENTION

Technical Problem

Recently, in order not to use lead during a manufacturing process of a semiconductor package, a palladium pre-plated (PPF) lead frame (has been widely used. According to the PPF lead frame, a palladium-plated layer is formed on a nickel-plated layer. During heat application of an assembly process, palladium is oxidized, or nickel is diffused into the palladium-plated layer to form a nickel oxide on a surface of the palladium-plated layer, thereby degrading wire-bonding characteristics and solder wettability/solderability.

To overcome this limitation, Korean Patent Application Laid-open Publication No. 2010-0103015 discloses a structure in which a gold (Au)-plated layer is formed on a palladium-plated layer. However, gold (Au) is several times to several hundreds of times more expensive by weight than other metal materials. Therefore, the cost of manufacturing a lead frame becomes too high, and thus the price competitiveness of the lead frame is weakened.

To reduce the manufacturing cost of a lead frame, Japanese Patent Application Laid-open Publication No. 1999-111909 discloses a structure in which a palladium alloy-plated layer is formed on a nickel-plated layer without using gold (Au). Here, the palladium content of the palladium alloy is 50% or more, and a thickness thereof ranges from 0.05 μm to 1 μm. However, palladium is almost as expensive as gold (Au). Therefore, when the palladium content of the palladium alloy-plated layer is 50% or more and a thickness thereof ranges from 0.05 μm to 1 μm, the cost of manufacturing a lead frame is not greatly reduced in comparison with using a gold (Au)-plated layer. Moreover, a palladium material greatly affects solder wettability. When the palladium content of the palladium material is 50% or more, solder wettability/solderability are degraded.

Solution to Problem

According to an aspect of the present invention, there is provided a lead frame having excellent solder wettability and solderability, well-bonded to a copper wire, and manufactured with low cost.

According to another aspect of the present invention, there is provided a semiconductor package manufactured by using the lead frame at low cost and having high reliability.

Advantageous Effects of Invention

As described above, a lead frame according to the present invention has strong adhesion to a bonding wire composed of a copper material, and a bleeding phenomenon of epoxy is efficiently suppressed in a die attach process. Further, since an outermost metal layer is formed of a silver-palladium alloy and not expensive gold, the cost of manufacturing the lead frame is greatly reduced. Moreover, the discoloration resistance characteristics of the lead frame are excellent, and solder wettability and solderability are improved.

In addition, a semiconductor package according to another aspect of the present invention is provided with the lead frame, and thus the semiconductor package has high reliability and can be manufactured at low cost.

BEST MODE FOR CARRYING OUT THE INVENTION

Figure 1:
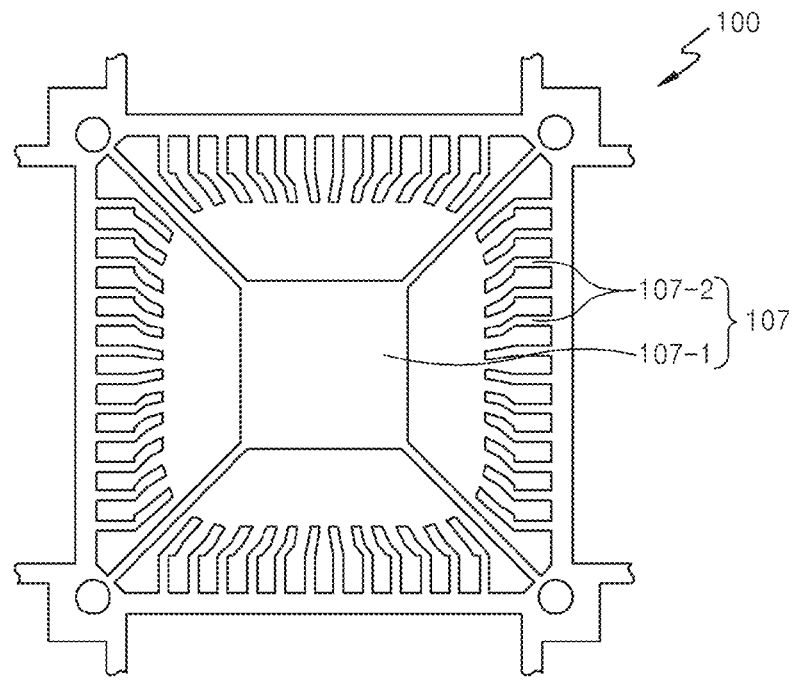
FIG. 1 is a planar diagram illustrating an example of a lead frame to which the present invention may be applied.

To solve the above problem, a lead frame according to the present invention includes a base material; a first metal layer formed on at least one surface of the base material, the first metal layer including nickel; a second metal layer formed on a surface of the first metal layer, the second metal layer including palladium; and a third metal layer formed on a surface of the second metal layer, the third metal layer including silver.

A thickness of the third metal layer is thinner than that of the second metal layer.

The third metal layer includes a silver-palladium alloy.

The lead frame further includes a fourth metal layer formed on a surface of the third metal layer, the fourth metal layer including a silver-palladium alloy.

A thickness of the third metal layer is thicker than that of the second metal layer.

The palladium content of the silver-palladium alloy of the fourth metal layer is about 5 to about 50 atomic % or about 4.4 to about 46 weight %.

A surface of the base material is modified to be rough.

The lead frame further includes a modified layer of which a surface is modified to be rough between the base material and the first metal layer.

The first metal layer includes a nickel alloy.

The second metal layer includes a palladium alloy.

The second metal layer is composed of the palladium alloy and at least one of nickel (Ni), copper (Cu), cobalt (Co), molybdenum (Mo), ruthenium (Ru), tin (Sn), and indium (In).

The lead frame further includes an organic film layer formed on a surface of the outermost metal layer.

At least one of gold (Au), nickel (Ni), copper (Cu), cobalt (Co), molybdenum (Mo), ruthenium (Ru), tin (Sn), and indium (In) may be added to the silver-palladium alloy.

To solve the above problem, a semiconductor package according to the present invention includes: a lead frame including a base material including a die pad and a lead part, a first metal layer formed on at least one surface of the base material, the first metal layer including nickel, a second metal layer formed on a surface of the first metal layer, the second metal layer including palladium, a third metal layer formed on a surface of the second metal layer, the third metal layer including silver, and a fourth metal layer formed on a surface of the third metal layer, the fourth metal layer including a silver-palladium alloy; a semiconductor chip bonded to the die pad; and a plurality of bonding wires connecting the semiconductor chip to the lead part.

The palladium content of the silver-palladium alloy of the fourth metal layer is about 5 to about 50 atomic % or about 4.4 to about 46 weight %.

To solve the above problem, a semiconductor package according to the present invention includes: a lead frame including a base material including a die pad and a lead part, a first metal layer formed on at least one surface of the base material, the first metal layer including nickel, a second metal layer formed on a surface of the first metal layer, the second metal layer including palladium, and a third metal layer formed on a surface of the second metal layer, the third metal layer including silver and the palladium diffused from the second metal layer; a semiconductor chip bonded to the die pad; and a plurality of bonding wires connecting the semiconductor chip to the lead part.

A thickness of the third metal layer is thinner than that of the second metal layer.

The third metal layer includes a silver-palladium alloy and the palladium diffused from the second metal layer.

MODE FOR THE INVENTION

Hereinafter, embodiments of the present invention will be described in detail with reference to the accompanying drawings. Like reference numerals refer to like elements throughout.

FIG. 1 is a planar diagram illustrating an example of a lead frame 100 to which the present invention may be applied. Referring to FIG. 1, the lead frame 100 includes a die pad 107-1 and a lead part 107-2. A semiconductor chip (211 of FIG. 9) is attached to the die pad 107-1. The lead part 107-2 includes a plurality of leads and is connected to the semiconductor chip (211 of FIG. 9) by a plurality of wires (231 of FIG. 13). Therefore, an electric signal output from the semiconductor chip (211 of FIG. 9) may be transmitted to an external device through the lead part 107-2, and an electric signal input to the lead part 107-2 from the external device may be transmitted to the semiconductor chip (211 of FIG. 9).

Figure 2:
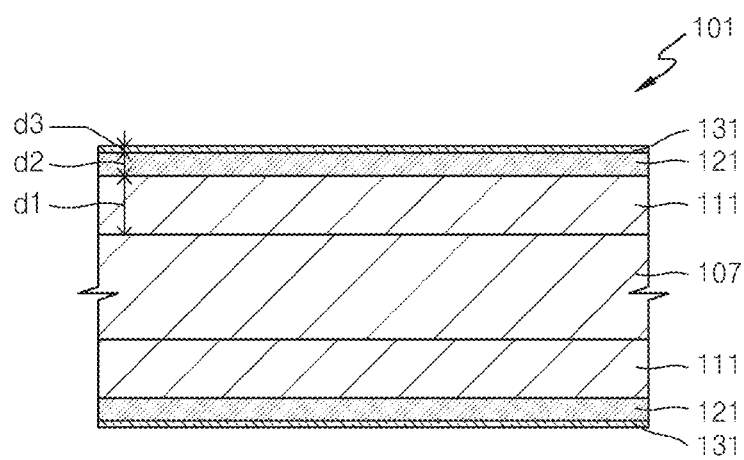
FIG. 2 is a cross-sectional view illustrating a part of a lead frame according to an embodiment of the present invention.
Figure 3:
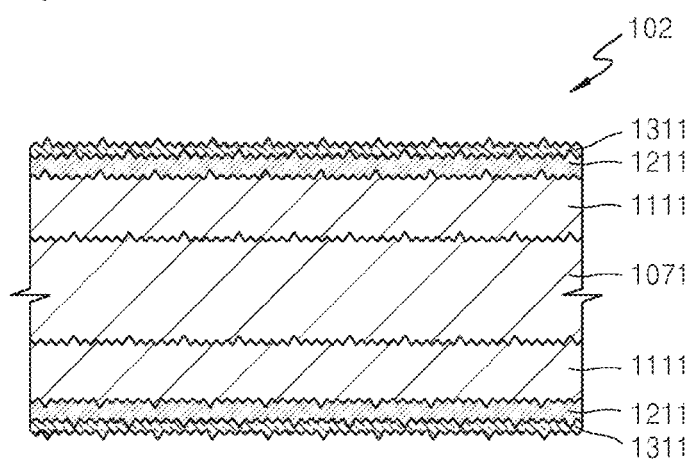
FIGS. 3 to 7 are cross-sectional views illustrating parts of lead frames according to other embodiments of the present invention.

FIG. 2 is a cross-sectional view illustrating a part of a lead frame 101 according to an embodiment of the present invention. FIG. 3 is a cross-sectional view illustrating a part of a lead frame 102 according to another embodiment of the present invention.

Referring to FIGS. 2 and 3, the lead frames 101 and 102 according to the embodiments of the present invention respectively include base materials 107 and 1071, first metal layers 111 and 1111, second metal layers 121 and 1211, and third metal layers 131 and 1311.

The base material 107 is configured with a metal plate plated with the first to third metal layers 111, 121, and 131 and is composed of a hardened material for evenly supporting the first to third metal layers 111, 121, and 131. A surface of the base material 107 may be smooth as illustrated in FIG. 2 or a surface of the base material 1071 may be rough as illustrated in FIG. 3.

To form the rough surface of the base material 1071 illustrated in FIG. 3, a mechanical or chemical surface treatment may be performed, a plasma treatment may be performed, or electrolytic polishing may be performed. Regarding surface roughness, it is preferable that a center line average height (Ra) is about 1500 Å or more. In the cases where the surface of the base material 1071 is modified as described above, adhesion between the metal layers formed on the base material 1071 may be improved. Further, in the cases where the surface of the base material 1071 is modified, the surface roughness of the base material 1071 affects the first to third metal layers 1111, 1211, and 1311 formed thereon so that each surface of the metal layers is rough. Therefore, the metal layers having a surface roughness affected by the base material 1071 have wide contact areas with a copper wire, and thus the bonding strength of the wire may be improved and adhesion to epoxy applied onto an outermost metal layer may also be improved.

The base material 107 corresponds to the die pad 107-1 and the lead part 107-2 of the lead frame 100 illustrated in FIG. 1. The base material 107 may be composed of a copper or copper alloy material. As illustrated in the drawings, the first to third metal layers 111, 121, and 131 may be formed on both sides of the base material 107, but they may also be formed on only one side thereof.

The first metal layer 111 is formed on a surface of the base material 107. The first metal layer 111 may be composed of nickel or a nickel alloy. It is preferable that a thickness d1 of the first metal layer 111 ranges from about 0.05 μm to about 1 μm. The first metal layer 111 is formed of a material having excellent adhesion to a precious metal layer to be formed thereon and is formed to a thickness that allows excellent adhesion to the precious metal layer. This first metal layer 111 prevents the copper or copper alloy material used as the base material 107 from diffusing into the precious metal layer. The first metal layer 111 may be formed by using an electrolytic plating method. For example, the base material 107 may be put into a metal ion solution vessel and high current density may be applied thereto so that the base material 107 is electrolytically plated in a short time to thus form the metal layer 111. Referring to FIG. 3, a surface of the first metal layer 1111 may be affected by the surface roughness of the base material 1071 and may thus be rough.

The second metal layer 121 is formed on a surface of the first metal layer 111. Referring to FIG. 3, a surface of the second metal layer 1211 may be affected by the surface roughness of the first metal layer 1111 and may thus be rough. The second metal layer 121 may be formed by performing electrolytic plating by using a palladium or palladium alloy material. It is preferable that a thickness d2 of the second metal layer 121 ranges from about 0.002 μm to about 0.03 μm, considering stability, material cost, and surface roughness. This metal layer 121 prevents the copper or nickel material of the base material 107 and first metal layer 111 from diffusing to a surface. In the cases where the second metal layer 121 is thick, the solderability is degraded due to a high melting point. Therefore, the second metal layer 121 is formed within the range stated above. In the cases where the second metal layer 121 is composed of a palladium alloy, metals such as nickel (Ni), copper (Cu), cobalt (Co), molybdenum (Mo), ruthenium (Ru), tin (Sn), and indium (In) may be added to palladium.

The third metal layer 131 is formed on a surface of the second metal layer 121. Referring to FIG. 3, a surface of the third metal layer 1311 may be affected by the surface roughness of the second metal layer 1211 and may thus be rough. The third metal layer 131 may be formed by performing electrolytic plating by using silver (Ag). The third metal layer 131 is thinner than the second metal layer 121 and is formed as a thin film. It is preferable that a thickness d3 of the third metal layer 131 ranges from about 0.0002 μm to about 0.05 μm. In the cases where the thickness of the third metal layer 131 is greater than about 0.05 μm, it is difficult for the palladium included in the second metal layer 121 to diffuse into or disperse on a surface of the third metal layer 131. In the cases where the thickness of the third metal layer 131 is less than about 0.0002 μm, the silver content is insignificant, and thus the solderability of the lead frame may be improved.

According to an embodiment of the present invention, since the third metal layer 131, including silver, is formed to the thin thickness d3, the palladium, which is included in the second metal layer 121, may be dispersed onto the third metal layer 131 by a heat treatment performed during a semiconductor package manufacturing process.

While a semiconductor package is manufactured by using the lead frames 101 and 102 according to the embodiments of the present invention, various heat treatments are performed. For example, various curing processes are performed at a high temperature, and a process of bonding a wire to the lead frame or attaching a solder ball thereto accompanies a heat treatment. During this high temperature state or heat treatment process, inter-diffusion between dissimilar metals, which increases entropy, rapidly occurs.

Since the thickness d3 of the third metal layer 131 is thinner than the thickness d2 of the second metal layer 121, the palladium included in the second metal layer 121 more easily diffuses into the third metal layer 131 during a heat treatment. Therefore, the third metal layer 131 of the lead frame 101 included in the semiconductor package includes palladium (Pd) in addition to silver (Ag). In the cases where the outermost layer of a lead frame includes both silver and palladium as described above, both merits of a silver material and a palladium material may be obtained. In detail, by virtue of silver, adhesion to the bonding wire (231 of FIG. 13) composed of a copper material is improved and a bleeding phenomenon of epoxy used for a die attach process is efficiently suppressed. Further, palladium allows excellent discoloration resistance.

The third metal layer 131 may include a silver-palladium alloy. In the cases where the third metal layer 131 includes the silver-palladium alloy, at least one of other metal materials, for example, gold (Au), ruthenium (Ru), nickel (Ni), and phosphorus (P), may be added. It is preferable that a fraction sum of these elements does not exceed about 5%. Here, for diffusion of the palladium included in the second metal layer 121, the third metal layer 131 is formed to a thinner thickness than that of the second metal layer 121, and particularly, is formed as a thin film. It is preferable that the thickness of the third metal layer 131 ranges from about 0.0002 μm to about 0.05 μm. In addition, to reduce the bleeding phenomenon of epoxy, a fraction of silver (Ag) included in the third metal layer 131. That is, in the cases where the third metal layer 131 is composed of the silver-palladium alloy, it is preferable that the palladium content is about 30% or less in consideration of the amount and cost of the palladium diffusing into the second metal layer 121.

Figure 4:
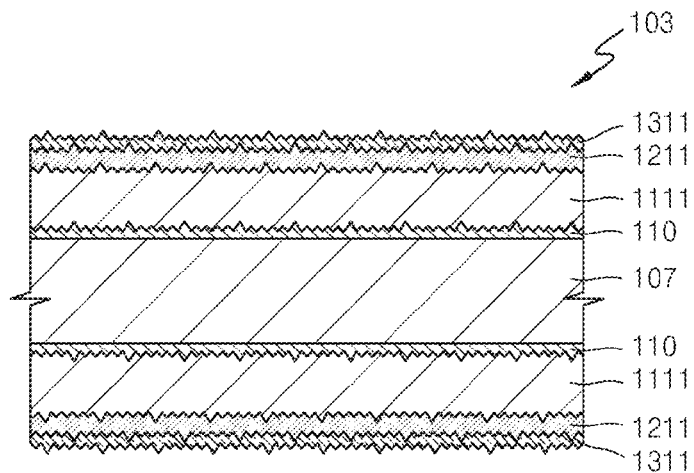

FIG. 4 is a cross-sectional view illustrating a part of a lead frame 103 according to another embodiment of the present invention.

The embodiment illustrated in FIG. 4 is different from other embodiments in that a modified layer 110 is further included between the base material 107 and the first metal layer 1111. The reference numerals of FIG. 4, which are the same as those of FIGS. 2 and 3, refer to the same elements. Since the same elements have the same functions or operations, descriptions of the same elements are omitted below.

The modified layer 110 is a metal layer including at least one of copper, copper alloy, nickel, and nickel alloy. A surface of the modified layer 110, which contacts the first metal layer 1111, may become rough through various treatments. For example, the surface of the modified layer 110 may become rough through a plasma treatment, electrolytic polishing, and other mechanical, physical, and chemical treatments. The surface roughness of the modified layer 110 affects the first to third metal layers 1111, 1211, and 1311 formed thereon so that each surface of the first to third metal layers becomes rough.

Figure 5:
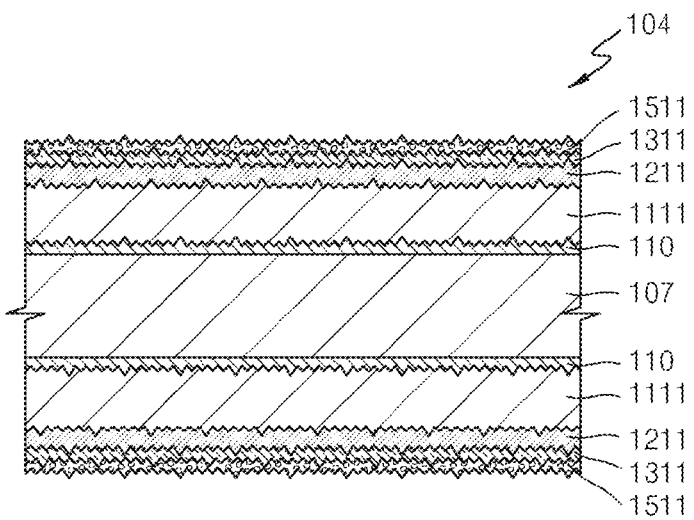

FIG. 5 is a cross-sectional view illustrating a part of a lead frame 104 according to another embodiment of the present invention.

In the embodiment illustrated in FIG. 5, an organic film layer 1511 is further formed on the third metal layer 1311, in comparison with the embodiment illustrated in FIG. 4. The reference numerals of FIG. 5, which are the same as those of FIG. 4, refer to the same elements. Since the same elements have the same functions or operations, descriptions of the same elements are omitted below.

Figure 9:
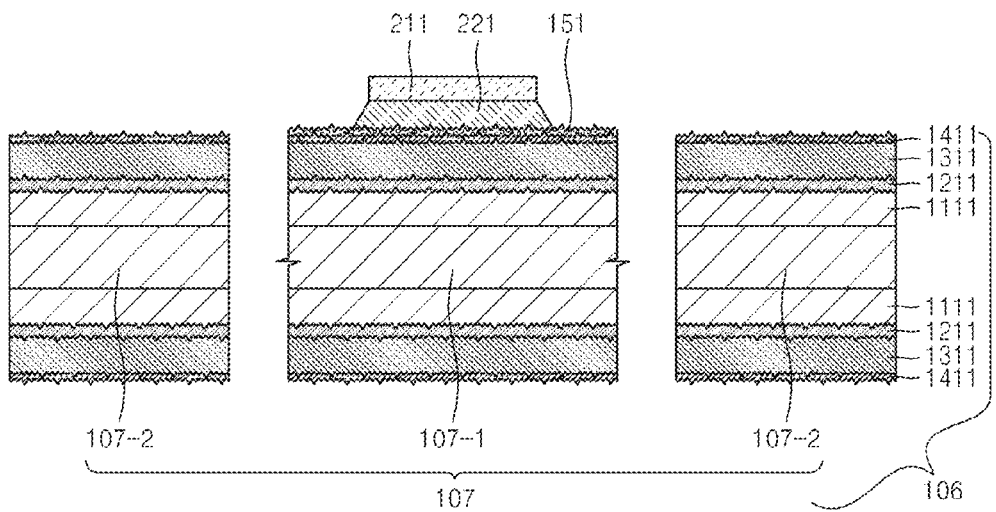
FIG. 9 is a cross-sectional view illustrating that a semiconductor chip is mounted on a lead frame, according to an embodiment of the present invention.

At least a part of a surface of the third metal layer 1311, for example, the die pad (107-1 of FIG. 9 on which the semiconductor chip (211 of FIG. 13) is mounted, may be coated with the organic film layer 151. The organic film layer 151 includes an organic material. In a die attach process for attaching the semiconductor chip (211 of FIG. 13) to the die pad (107-1 of FIG. 9), the semiconductor chip (211 of FIG. 13) is mounted on the die pad (107-1) by means of epoxy. During this process, the bleeding phenomenon of epoxy may occur. Here, the organic film layer 151 serves to efficiently suppress the bleeding phenomenon of epoxy.

Although FIG. 5 illustrates that the organic film layer 151 is formed on the outermost metal layer of the lead frame 103 of FIG. 4, the present invention is not limited thereto. Therefore, the organic film layer 151 may be respectively formed on the outermost metal layers of the lead frames 101 and 102 illustrated in FIGS. 2 and 3.

Figure 6:
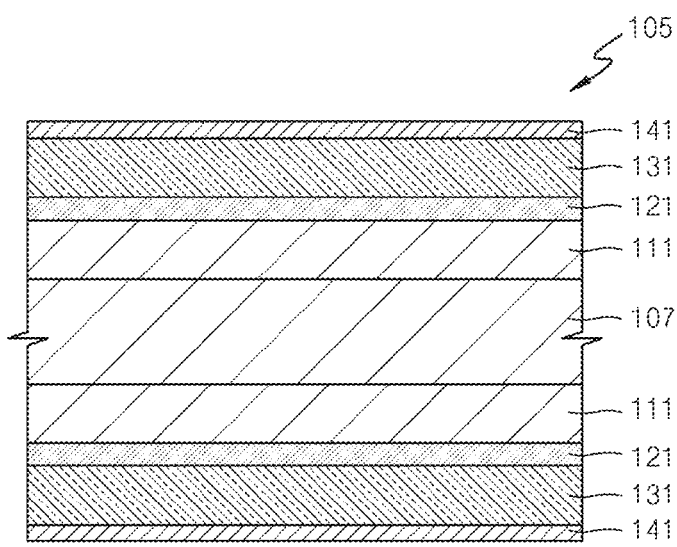

FIG. 6 is a cross-sectional view illustrating a part of a lead frame 105 according to another embodiment of the present invention.

The embodiment illustrated in FIG. 6 is different from that illustrated in FIG. 2 in that a fourth metal layer 141, including a silver-palladium alloy, is formed on the third metal layer 131, and the third metal layer 131 is thicker than the second metal layer 121. The reference numerals of FIG. 6, which are the same as those of FIG. 2, refer to the same elements. Since the same elements have the same functions or operations, descriptions of the same elements are omitted below.

The third metal layer 131 is formed on a surface of the second metal layer 121. The third metal layer 131 may be formed by performing electrolytic plating by using silver (Ag). It is preferable that the thickness of the third metal layer 131 is about 0.02 μm to about 0.5 μm and is thus thicker than that of the second metal layer 121. Since the third metal layer 131 is composed of a silver material, adhesion between the base material 107 composed of copper and the bonding wire (231 of FIG. 13) composed of copper is maximized, oxidization of the palladium material of the second metal layer 121 is minimized, and the solder wettability is improved.

The fourth metal layer 141 is formed on a surface of the third metal layer 131 as the outermost metal layer of the lead frame 105. The fourth metal layer 141 is formed to prevent discoloration or oxidization of the lead frame 105. The fourth metal layer 141 may be formed of a silver (Ag)-palladium (Pd) alloy material. Here, the palladium content may be about 5 to about 50 atomic % or about 4.4 to about 46 weight %. The balance may be silver. Here, in the cases where the palladium content is less than about 5 atomic % or about 4.4 weight %, the effect of the discoloration resistance of the outermost layer is insignificant. Further, in the cases where the palladium content is more than about 50 atomic % or about 46 weight %, the wire bonding is not performed well and the solderability is not good.

Other metal materials, for example, gold (Au), nickel (Ni), copper (Cu), cobalt (Co), molybdenum (Mo), ruthenium (Ru), tin, and indium (In), may be added to the silver-palladium alloy included in the fourth metal layer 141. It is preferable that a fraction sum of these elements does not exceed about 10%. It is preferable that the fourth metal layer 141 is formed to a thin thickness ranging from about 0.0002 μm to about 0.02 μm in consideration of stability, price, and surface roughness.

As described above, according to an embodiment of the present invention, even though the third metal layer 131 is thick, the fourth metal layer 141 composed of the silver-palladium alloy is formed on the third metal layer 131 so as to minimize discoloration of the third metal layer 131 composed of silver. Since the fourth metal layer 141 that is the outermost layer of the lead frame 105 includes silver (Ag) of which an activity is greater than that of gold (Au), the bleeding phenomenon of epoxy used for the die attach process is efficiently reduced. To reduce the bleeding phenomenon of epoxy, a fraction of silver (Ag) included in the fourth metal layer 141 needs to be secured. That is, in the cases where the fourth metal layer 141 is formed of the silver-palladium alloy, it is preferable that a fraction of palladium does not exceed about 50%. In the cases where the fourth metal layer 141 is formed of the silver-palladium alloy, ductility and corrosion resistance of the lead frame 105 are improved.

Figure 7:
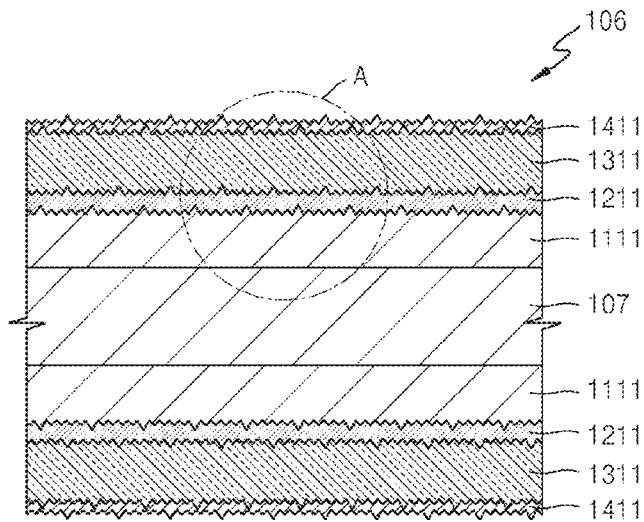
Figure 8:
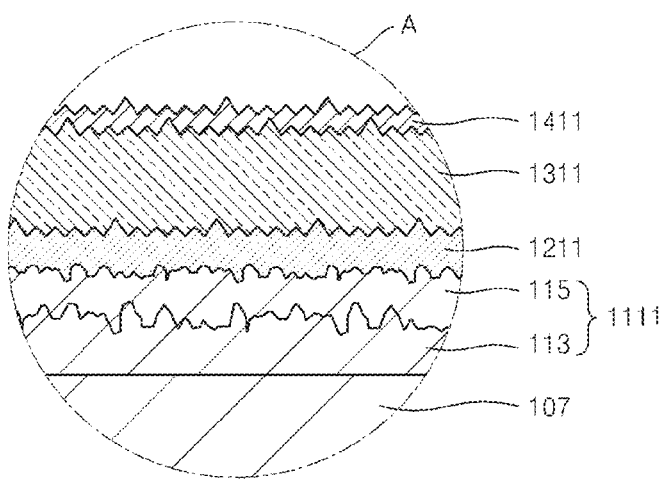
FIG. 8 is a diagram magnifying part A illustrated in FIG. 7.

FIG. 7 is a cross-sectional view illustrating a part of a lead frame 106 according to another embodiment of the present invention. FIG. 8 is a diagram magnifying a part of the lead frame 106 illustrated in FIG. 7.

In the embodiment illustrated in FIG. 7, a surface of the first metal layer 1111 is rough, and the second to fourth metal layers 1211, 1311, and 1411 on the first metal layer 1111 also have rough surfaces. The reference numerals of FIG. 7, which are the same as those of FIG. 6, refer to the same elements. Since the same elements have the same functions or operations, descriptions of the same elements are omitted below.

The first metal layer 1111 may include two layers, i.e. a seed layer 113 and a protective layer 115. The seed layer 113 is formed on a surface of the base material 107, and the protective layer 115 is formed on a surface of the seed layer 113. The seed layer 113 and the protective layer 115 may be composed of the same metal or different metal materials.

The seed layer 113 may have a rough surface. To this end, the base material 107 is put into a copper sulfate solution, and high current density of about 15 A/dm2 (ASD) or more is applied thereto for a short time of about 5 to about 20 seconds so as to rapidly grow the seed layer 113. Accordingly, the surface of the seed layer 113 becomes rough and has a nodule shape.

Hereinafter, a method of forming the seed layer 113 and the protective layer 115 using the same metal, for example, copper, and of allowing the seed layer 113 and the protective layer 115 to have rough surfaces will be described.

A copper sulfate solution for forming the seed layer 113 with copper includes sulfuric acid ($CuSO_4$) and copper sulfate hydrate ($CuSO_4.5H_2O$). It is preferable that the concentration of the sulfuric acid and copper sulfate hydrate ($CuSO_4.5H_2O$) is about 10 to about 30 g/l.

In the cases where the concentration of copper sulfate hydrate ($CuSO_4.5H_2O$) is lower than about 10 g/l, copper sulfate ions are insufficient, thereby increasing a period of time for electrolytically plating the seed layer 113. Accordingly, currently density needs to be increased. In this case, the growth of the seed layer 113 may be unstable, and thus adhesion between the seed layer 113 and the base material 107 may be weakened. On the contrary, in the cases where the concentration of copper sulfate hydrate ($CuSO_4.5H_2O$) is higher than about 30 g/l, the seed layer 113 may be excessively grown, causing generation of smut. This smut may cause a peeling phenomenon in which the seed layer 113 peels from the base material 107 or a surface of the seed layer 113 peels. Further, if the concentration of copper sulfate hydrate ($CuSO_4.5H_2O$) is higher than about 30 g/l, the seed layer 113 may be excessively grown, causing generation of burr. Therefore, It is preferable that the concentration of copper sulfate hydrate ($CuSO_4.5H_2O$) is about 10 to about 30 g/l.

It is preferable that the concentration of sulfuric acid is about 20 to about 60 ml/l. In the cases where the concentration of sulfuric acid is lower than about 20 ml/l, conductive salts are insufficient, and thus a current-concentrated part of the seed layer 113 may be burned and become black. In this case, since the seed layer 113 does not have a required surface roughness, conductivity may be reduced. On the contrary, in the cases where the concentration of sulfuric acid is higher than about 60 ml/l, conductive salts are excessively generated, and thus the seed layer 113 becomes glossy. Accordingly, it is difficult to form the seed layer 113 having a desired surface roughness.

When the seed layer 113 is formed by using an electrolytic plating method, it is preferable to set a process time to about 5 to about 20 seconds. If the process time is shorter than about 5 seconds, adhesion between the seed layer 113 and the base material 107 is degraded. If the process time is longer than about 20 seconds, a surface of the seed layer 113 peels.

It is preferable that surface roughness (Ra) of the seed layer 113 is about 0.1 μm to about 0.5 μm on average. If the surface roughness of the seed layer 113 is less than about 0.1 μm, a surface concave-convex degree is too small, and thus a concavo-convex degree of the protective layer 115 formed on the seed layer 113 and a concavo-convex degree of a later-formed plated layer becomes small. Therefore, the effect of interlocking with a molding part may be decreased. On the contrary, if the surface roughness of the seed layer 113 is greater than about 0.5 μm, the seed layer 113 is unstable, and thus a part of the seed layer 113 peels or is separated.

The protective layer 115 is formed on a surface of the seed layer 113, and may be formed by using a low-speed electrolytic plating method in which low current density is applied in comparison with the seed layer 113. In the cases where the protective layer 115 and the seed layer 113 are formed of the same metal material as described above, the adhesion strength between the seed layer 113 and the protective layer is excellent and a manufacturing process is simple. Thus, the first plated layer 111 may be rapidly formed.

It is preferable that the protective layer 115 is formed to a thickness ranging from about 0.125 μm to about 1.0 μm. If the thickness of the protective layer 115 is less than about 0.125 µm, the adhesion to the seed layer 113 may be insufficiently complemented. On the contrary, if the thickness of the protective layer 115 is greater than about 1.0 µm, the surface roughness of the protective layer 115 may be reduced.

Since the protective layer 115 is thinly formed on a surface of the seed layer 113, the surface roughness of the seed layer 113 may affect a surface of the protective layer 115. That is, the surface roughness of the protective layer 115 corresponds to that of the seed layer 113, and may be about 0.1 µm to about 0.5 µm, which is similar to the surface roughness of the seed layer 113.

Since the seed layer 113 is rapidly grown by high current, adhesion to the base material 107 may be a little bit weakened or a part of the seed layer 113 may be separated. However, the protective layer 115 is formed on the surface of the seed layer 113 and complements a weak adhesion part of the seed layer 113. Therefore, the adhesion strength of the seed layer 113 may be efficiently improved. Accordingly, the seed layer 113 may be stably fixed to the base material 107. Further, the protective layer 115 serves to protect the seed layer 113 from foreign substances.

As described above, since the adhesion strength of the seed layer 113 is complemented by the protective layer 115, the first metal layer 111 may be overall stably fixed to the base material 107. Further, the first metal layer 111 is formed at once on the base material 107 and thus the first metal layer 111 has excellent flexibility in comparison with a plated layer having surface roughness. Therefore, the bonding strength of a wire may be more improved in the wire bonding process.

Even when the seed layer 113 and the protective layer 115 are formed of different metals, the above-described method may be similarly performed.

The second metal layer 1211 is formed on a surface of the first metal layer 1111. A surface of the second metal layer 1211 may be affected by the surface roughness of the first metal layer 1111 and may thus be rough. Surfaces of third and fourth metal layers 1311 and 1411 may also be affected by the surface roughness of the first metal layer 1111 and may thus be rough.

Although not illustrated in the drawing, a surface of the lead frame 106 may become rough by allowing the base material 107 to have a rough surface or by forming the modified layer 110 of which a surface is rough between the base material 107 and the first metal layer 1111 as described with respect to the embodiments of FIGS. 3 and 4.

FIG. 9 is a diagram illustrating that a semiconductor chip 211 is mounted on the lead frame 106 according to an embodiment of the present invention.

Referring to FIG. 9, at least a part of a surface of the fourth metal layer 1411, for example, the die pad 107-1 on which the semiconductor chip 211 is mounted, may be coated with the organic film layer 151. The organic film layer 151 includes an organic material. In the die attach process for attaching the semiconductor chip 211 to the die pad 107-1 of the lead frame 107, the semiconductor chip 211 is mounted on the die pad 107-1 by means of epoxy. During this process, the bleeding phenomenon of epoxy may occur. Here, the organic film layer 151 serves to efficiently suppress the bleeding phenomenon of epoxy.

Figure 10:
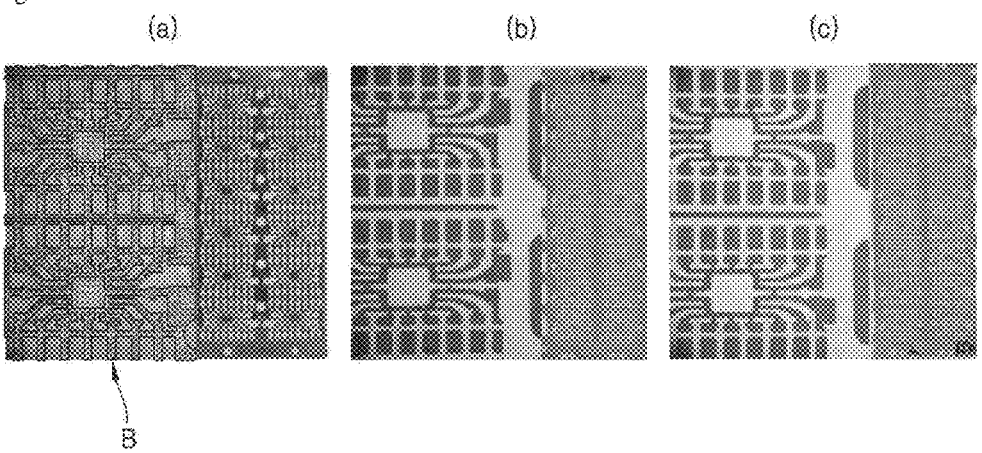
FIG. 10 illustrates the results of discoloration tests on lead frames.

FIG. 10 illustrates the results of discoloration tests on lead frames. FIG. 10(A) illustrates a result of a discoloration test on a lead frame in which the base material 107 of FIG. 2 is plated with a nickel layer (25 µm)/palladium layer (0.5 µm)/silver layer (5 µm), FIG. 10(B) illustrates a discoloration test on a lead frame in which the base material 107 of FIG. 2 is plated with a nickel layer (25 µm)/palladium layer (0.5 µm)/ gold layer (0.25 µm), and FIG. 10(C) illustrates a discoloration test on a lead frame according to the present invention, i.e. a lead frame in which the base material 107 of FIG. 2 is plated with a nickel layer (25 µm)/palladium layer (0.5 µm)/silver layer (5 µm)/silver-palladium alloy layer (0.2 µm) (palladium content: 20 atomic %).

For the tests, the lead frames undergo a thermal history (about 1 hour at a temperature of about 175° C., about 40 minutes at a temperature of about 200° C., about 4 hours at a temperature of about 175° C.) at a manufacturing process, and are put into a chamber containing a 5%-ammonium sulfide solution for about 15 minutes under a constant temperature and humidity condition (20° C., 45% RH).

Referring to FIG. 10, it may be understood that the lead frames of FIGS. 10(B) and 10(C) are hardly discolored and the lead frame of FIG. 10(A) is greatly discolored (show B part). That is, the lead frame according to the present invention, i.e. the lead frame of FIG. 10(C), has discoloration resistance characteristics similar to those of the lead frame of FIG. 10(B), which has the gold (Au)-plated layer. However, the discoloration resistance characteristics of the lead frame of FIG. 10(C) are superior to those of the typical lead frame of FIG. 10(A).

Figure 11:
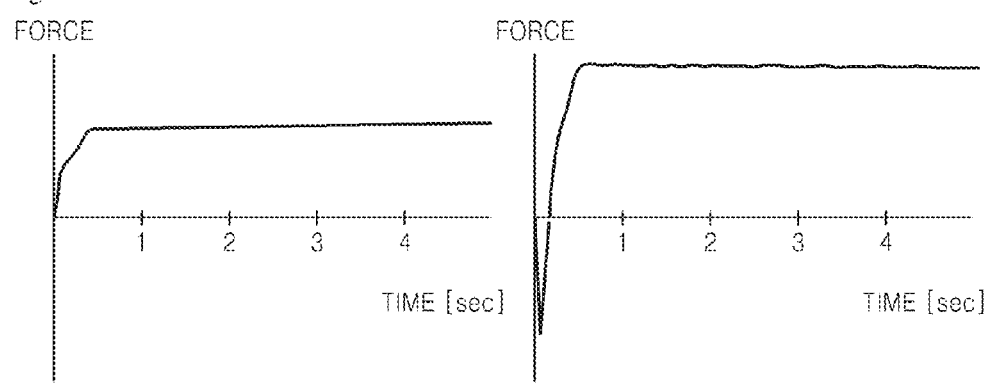
FIG. 11 illustrates a result of a solder wettability test on a lead frame according to the present invention.
Figure 12:
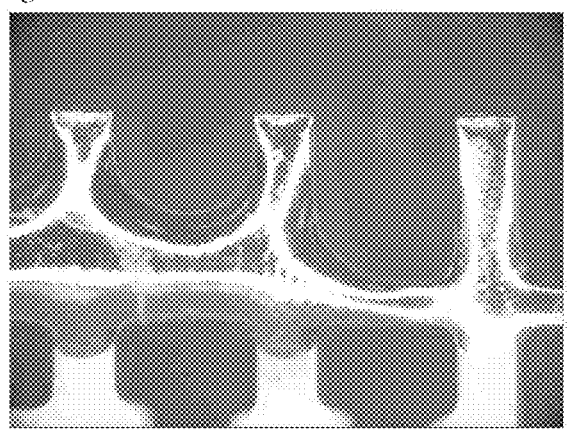
FIG. 12 illustrates a result of a solderability test on a lead frame according to the present invention.

FIG. 11 illustrates a result of a solder wettability test on the lead frame 101 of FIG. 2 according to the present invention, and FIG. 12 illustrates a result of a solderability test on the lead frame 101 of FIG. 2 according to the present invention.

The lead frame 101 of FIG. 2 used for the test has a structure in which the base material 107 of FIG. 2 is plated with a nickel layer/palladium layer (0.5 µm)/silver layer (5 µm)/silver-palladium alloy layer (0.2 µm) (palladium content: 20 atomic %).

For the test, the lead frame 101 of FIG. 2 is maintained at a temperature of about 175° C. for about 4 hours, is exposed to steam aging for about 8 hours, and is exposed to flux (R-flux: α-100) for about 5 seconds.

Referring to FIG. 12, a zero cross time is measured twice at about 0.0 seconds and about 0.3 seconds respectively. This result indicates that the solder wettability is excellent.

Referring to FIG. 12, it may be understood that solder is disposed on the leads of the lead frame 101 of FIG. 2 with an overall sufficient thickness. This result indicates that the solderability is excellent.

Table 1 shown below shows a result of a test on the wire bonding strength of the lead frame 101 of FIG. 2 according to the present invention.

Table 1 compares a lead frame in which gold (Au) is formed on an outermost layer and the lead frame 101 of FIG. 2 according to the present invention, i.e. the lead frame in which the base material is plated with a nickel layer/palladium layer/silver layer (5 µm)/silver-palladium alloy layer (0.2 µm) (palladium content: 20 atomic %).

The wire bonding strength test is conducted after three wire-bonded lead frames are cured at a temperature of about 175° C. for about 2 hours.

TABLE 1

|  | Lead frame in which the gold layer is formed on an outermost layer | Lead frame in which the base material is plated with nickel layer/palladium layer/silver layer (5 µm)/silver-palladium alloy layer (0.2 µm) (palladium content: 20 atomic %) |
| --- | --- | --- |
| Average (gf) | 7.69 | 7.45 |
| Minimum value (gf) | 4.95 | 4.99 |

As shown in Table 1, the wire bonding strength of the lead frame 101 of FIG. 2 according to the present invention is as good as that of the lead frame in which the gold layer is formed on the outermost layer.

Figure 13:
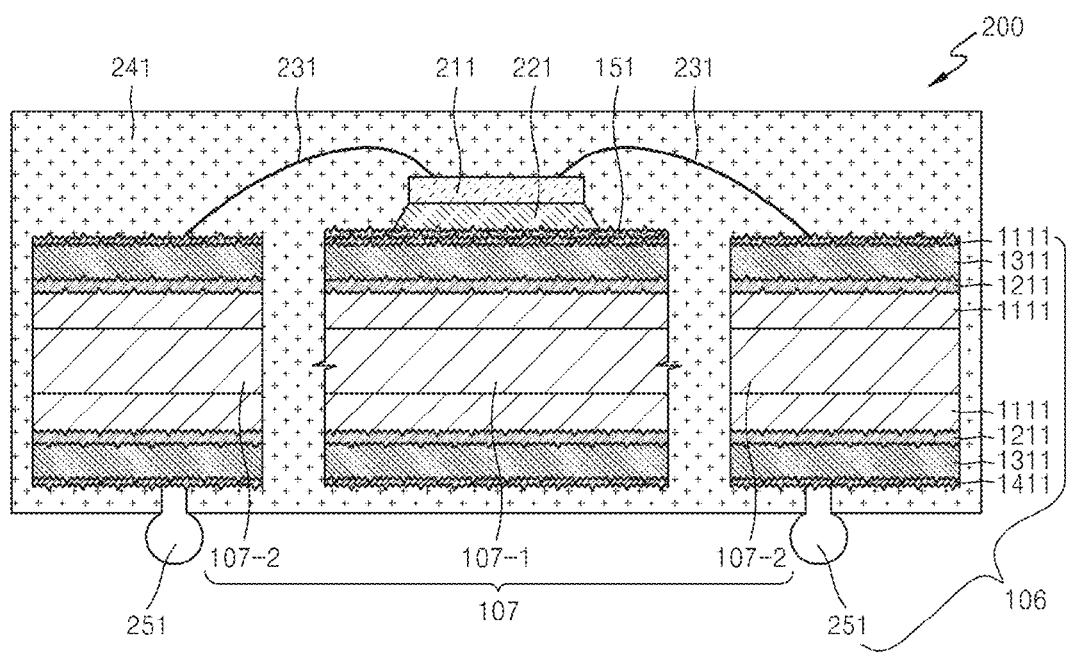
FIG. 13 is a cross-sectional view of a semiconductor package manufactured by using a lead frame according to the present invention.

As described above, the lead frame 101 of FIG. 2 according to the present invention has strong adhesion to the bonding wire 231 of FIG. 13 composed of a copper material, and the bleeding phenomenon of epoxy is efficiently suppressed in the die attach process. Further, since the outermost metal layer 141 of FIG. 2 is formed of the silver-palladium alloy and not expensive gold, the cost of manufacturing the lead frame 101 of FIG. 2 is greatly reduced. Moreover, the discoloration resistance characteristics are excellent, and the solder wettability and solderability are improved.

FIG. 13 is a diagram schematically illustrating an example of a semiconductor package 200 manufactured by using the lead frame 106 according to the present invention. Referring to FIG. 13, the semiconductor chip 211 is bonded to the die pad 107-1 by epoxy 221 and is electrically connected to the lead part 107-2 by using bonding wires 231, and a plurality of solder balls 251 are formed on an opposite side to the semiconductor chip 211. The plurality of solder balls 251 are electrically connected to the bonding wires 231 through via lines (not illustrated) that electrically connect upper and lower parts of the lead part 107-2. As a result, the plurality of solder balls 251 may send and receive electric signals to and from the semiconductor chip 211. By sealing the semiconductor chip 211, the bonding wires 231, and a part of the or the whole lead frame 106 with mold resin 241, for example, an epoxy mold compound, the semiconductor package 200 is completed.

As described above, when the semiconductor chip 211 is bonded to the lead frame 106, the bleeding phenomenon of the epoxy 221 is efficiently suppressed, and the bonding strength of the bonding wires 231 is greatly improved. Thus, the semiconductor package 200 is has high reliability.

Further, due to a rough surface of the lead frame 106, the adhesion between the lead frame 106 and the mold resin 241 is excellent. Therefore, interface separation of the mold resin 241 is prevented, and foreign substances are prevented from permeating the lead frame 106 in the mold resin 241.

Although FIG. 13 illustrates that the semiconductor package 200 uses the lead frame 106 of FIG. 7, the semiconductor package may be manufactured in the same manner by using the lead frames 101 to 105 illustrated in FIGS. 2 to 6. In the cases where the semiconductor package 200 is manufactured by using the lead frames 101 to 104 illustrated in FIGS. 2 to 5, the third metal layers 131 and 1311 of the lead frames 101 to 104 include palladium diffused from the second metal layers 121 and 1211 in addition to silver after the semiconductor package 200 is manufactured.

Although the present invention has been described with reference to the exemplary embodiments illustrated in the drawings, it should be understood that numerous other modifications and embodiments can be devised by those skilled in the art. Therefore, the technical protection scope of the present invention should be determined based on the technical concept of the following claims.

INDUSTRIAL APPLICABILITY

The embodiments of the present invention can be applied to a lead frame, a semiconductor package including the same, and various electronic devices including the semiconductor package.

The invention claimed is:

1. A lead frame comprising:
a base material;
a first metal layer formed on at least one surface of the base material, the first metal layer comprising nickel;
a second metal layer formed on a surface of the first metal layer, the second metal layer comprising palladium; and
a third metal layer formed on a surface of the second metal layer, the third metal layer comprising silver,
wherein palladium is diffused into the third metal layer from the second metal layer, and
wherein a thickness of the third metal layer is thinner than that of the second metal layer.

2. The lead frame of claim 1, wherein the third metal layer comprises a silver-palladium alloy.

3. The lead frame of claim 1, wherein a surface of the base material is modified to be rough.

4. The lead frame of claim 1, further comprising a modified layer of which a surface is modified to be rough between the base material and the first metal layer.

5. The lead frame of claim 1, wherein the first metal layer comprises a nickel alloy.

6. The lead frame of claim 1, wherein the second metal layer comprises a palladium alloy.

7. The lead frame of claim 6, wherein the second metal layer is composed of the palladium alloy and at least one of nickel (Ni), copper (Cu), cobalt (Co), molybdenum (Mo), ruthenium (Ru), tin (Sn), and indium (In).

8. The lead frame of claim 1, further comprising an organic film layer formed on a surface of the outermost metal layer.

9. The lead frame of claim 1, wherein at least one of gold (Au), nickel (Ni), copper (Cu), cobalt (Co), molybdenum (Mo), ruthenium (Ru), tin (Sn), and indium (In) is added to the silver-palladium alloy.

10. A semiconductor package comprising:
a lead frame comprising a base material comprising a die pad and a lead part, a first metal layer formed on at least one surface of the base material, the first metal layer comprising nickel, a second metal layer formed on a surface of the first metal layer, the second metal layer comprising palladium, a third metal layer formed on a surface of the second metal layer, the third metal layer comprising silver, and a fourth metal layer formed on a surface of the third metal layer, the fourth metal layer comprising a silver-palladium alloy;
a semiconductor chip bonded to the die pad; and
a plurality of bonding wires connecting the semiconductor chip to the lead part,
wherein palladium is diffused into the third metal layer from the second metal layer.

11. The semiconductor package of claim 10, wherein the palladium content of the silver-palladium alloy of the fourth metal layer is about 5 to about 50 atomic % or about 4.4 to about 46 weight %.

12. A semiconductor package comprising:
a lead frame comprising a base material comprising a die pad and a lead part, a first metal layer formed on at least one surface of the base material, the first metal layer comprising nickel, a second metal layer formed on a surface of the first metal layer, the second metal layer comprising palladium, and a third metal layer formed on a surface of the second metal layer, the third metal layer comprising silver and the palladium diffused from the second metal layer;
a semiconductor chip bonded to the die pad; and
a plurality of bonding wires connecting the semiconductor chip to the lead part,
wherein a thickness of the third metal layer is thinner than that of the second metal layer.

13. The semiconductor package of claim 11, wherein the third metal layer comprises a silver-palladium alloy and the palladium diffused from the second metal layer.

14. The lead frame of claim 1, wherein the thickness of the third metal layer is less than 0.05 μm.

15. A lead frame comprising:
a base material;
a first metal layer formed on at least one surface of the base material, the first metal layer comprising nickel;
a second metal layer formed on a surface of the first metal layer, the second metal layer comprising palladium;
a third metal layer formed on a surface of the second metal layer, the third metal layer comprising silver; and
a fourth metal layer formed on a surface of the third metal layer, the fourth metal layer comprising a silver-palladium alloy,
wherein palladium is diffused into the third metal layer from the second metal layer.

16. The lead frame of claim 15, wherein a thickness of the third metal layer is thicker than that of the second metal layer.

17. The lead frame of claim 15, wherein the palladium content of the silver-palladium alloy of the fourth metal layer is about 5 to about 50 atomic % or about 4.4 to about 46 weight %.

* * * * *